(12) United States Patent
Cirigliano

(10) Patent No.: US 7,364,623 B2
(45) Date of Patent: Apr. 29, 2008

(54) CONFINEMENT RING DRIVE

(75) Inventor: Peter Cirigliano, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 415 days.

(21) Appl. No.: 11/044,576

(22) Filed: Jan. 27, 2005

(65) Prior Publication Data

US 2006/0162657 A1    Jul. 27, 2006

(51) Int. Cl.
C23C 16/00 (2006.01)
C23F 1/00 (2006.01)
H01L 21/306 (2006.01)

(52) U.S. Cl. .................. 118/715; 315/111.71; 156/915; 156/345.47

(58) Field of Classification Search ........... 315/111.71; 118/715; 156/345.13, 345.15, 345.24, 345.26
See application file for complete search history.

(56) References Cited

U.S. PATENT DOCUMENTS 3,808,816 A * 5/1974 Lucas ........................... 60/530
6,019,060 A * 2/2000 Lenz ........................ 118/723 R
2005/0263070 A1* 12/2005 Fink ........................... 118/715

* cited by examiner

Primary Examiner—Karla Moore
Assistant Examiner—Rakesh K Dhingra
(74) Attorney, Agent, or Firm—Martine Penilla & Gencarella, LLP

(57) ABSTRACT

A confinement assembly for a semiconductor processing chamber is provided. The confinement assembly includes a plurality of confinement rings disposed over each other. Each of the plurality of confinement rings are separated by a space and each of the plurality of confinement rings have a plurality of holes defined therein. A plunger extending through aligned holes of corresponding confinement rings is provided. The plunger is moveable in a plane substantially orthogonal to the confinement rings. A proportional adjustment support is affixed to the plunger. The proportional adjustment support is configured to support the confinement rings, such that as the plunger moves in the plane, the space separating each of the plurality of confinement rings is proportionally adjusted. In one embodiment the proportional adjustment support is a bellows sleeve. A semiconductor processing chamber and a method for confining a plasma in an etch chamber having a plurality of confinement rings are provided.

9 Claims, 7 Drawing Sheets

CONFINEMENT RING DRIVE

BACKGROUND OF THE INVENTION

1. Field of the Invention

The present invention relates generally to semiconductor manufacturing and, more particularly, to a method and apparatus for providing a confinement ring drive that provides proportional spacing between the confinement rings over a travel range.

2. Description of the Related Art

During the manufacturing of semiconductor-based devices, it is common to deposit layers of material onto a substrate. Each of the layers of material may undergo an etching process. Etching of the layers may be accomplished by a wide variety of techniques including plasma-enhanced etching.

The plasma etchers performing these operations may include confinement rings to confine the plasma within a region of the etch chamber. The confinement rings serve to confine the plasma and also protect the chamber walls. There are dynamic limits to how wide the confinement ring spacing can be driven to control pressure if equal gaps between all of the confinement rings are not established. The capability of proportional confinement ring spacing can effectively increase the dynamic range of pressure control while minimizing undesired effects such as plasma unconfinement when these non-proportional spacing limits are exceeded.

In view of the foregoing, there is a need for a method and apparatus that provides for uniform movement of the confinement rings over a range of travel of the confinement rings.

SUMMARY OF THE INVENTION

Broadly speaking, the present invention fills these needs by providing a method and apparatus for proportionally maintaining spacing between confinement rings. It should be appreciated that the present invention can be implemented in numerous ways, including as a method, a system, or an apparatus. Several inventive embodiments of the present invention are described below.

In one embodiment, a confinement assembly for a semiconductor processing chamber is provided. The confinement assembly includes a plurality of confinement rings disposed over each other. Each of the plurality of confinement rings are separated by a space and each of the plurality of confinement rings have a plurality of holes defined therein. A plunger extending through aligned holes of corresponding confinement rings is provided. The plunger is moveable in a plane substantially orthogonal to the confinement rings. A proportional adjustment support is affixed to the plunger. The proportional adjustment support is configured to support the confinement rings, such that as the plunger moves in the plane, the space separating each of the plurality of confinement rings is proportionally adjusted. In one embodiment the proportional adjustment support is a bellows sleeve.

In another embodiment, a semiconductor processing chamber is provided. The semiconductor processing chamber includes a plurality of confinement rings configured to confine a plasma within a region of the chamber. A plurality of bellows sleeves supporting the confinement rings is also included. A plurality of plungers affixed to corresponding bellows sleeves is included. The plurality of plungers move along an axis substantially orthogonal to a plane of the confinement rings such that movement of the plurality of plungers results in spaces between each of the plurality of confinement rings to proportionally adjust.

In yet another embodiment, a method for confining a plasma in an etch chamber having a plurality of confinement rings is provided. The method initiates with performing an etch process in the etch chamber. Then, the processing parameters of the etch chamber are monitored. Next, spacing between each of the plurality of the confinement rings is adjusted in a manner that the spacing adjustment applied to each of the plurality of the confinement rings is substantially equal.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a system, apparatus and method for proportionally adjusting confinement rings to enhance etch operations within a semiconductor processing chamber. It will be obvious, however, to one skilled in the art, that the present invention may be practiced without some or all of these specific details. In other instances, well known process operations have not been described in detail in order not to unnecessarily obscure the present invention.

The embodiments of the present invention provide a system, apparatus, and method for providing substantially linear control of the movement of the confinement rings over the entire range of travel of a plunger. This results in uniform movement of the confinement rings so that the spacing between each confinement ring remains substantially the same relative to one another. That is, the embodiments described herein allow for proportional control of the spacing between the confinement rings. In one embodiment, a confinement ring drive capable of providing uniform spacing control for a plurality of confinement rings through a bellows sleeve is provided. The confinement ring drive incorporates a cam-based arrangement that drives a plunger which results in the uniform movement of the confinement rings, as discussed in more detail below.

Figure 1:
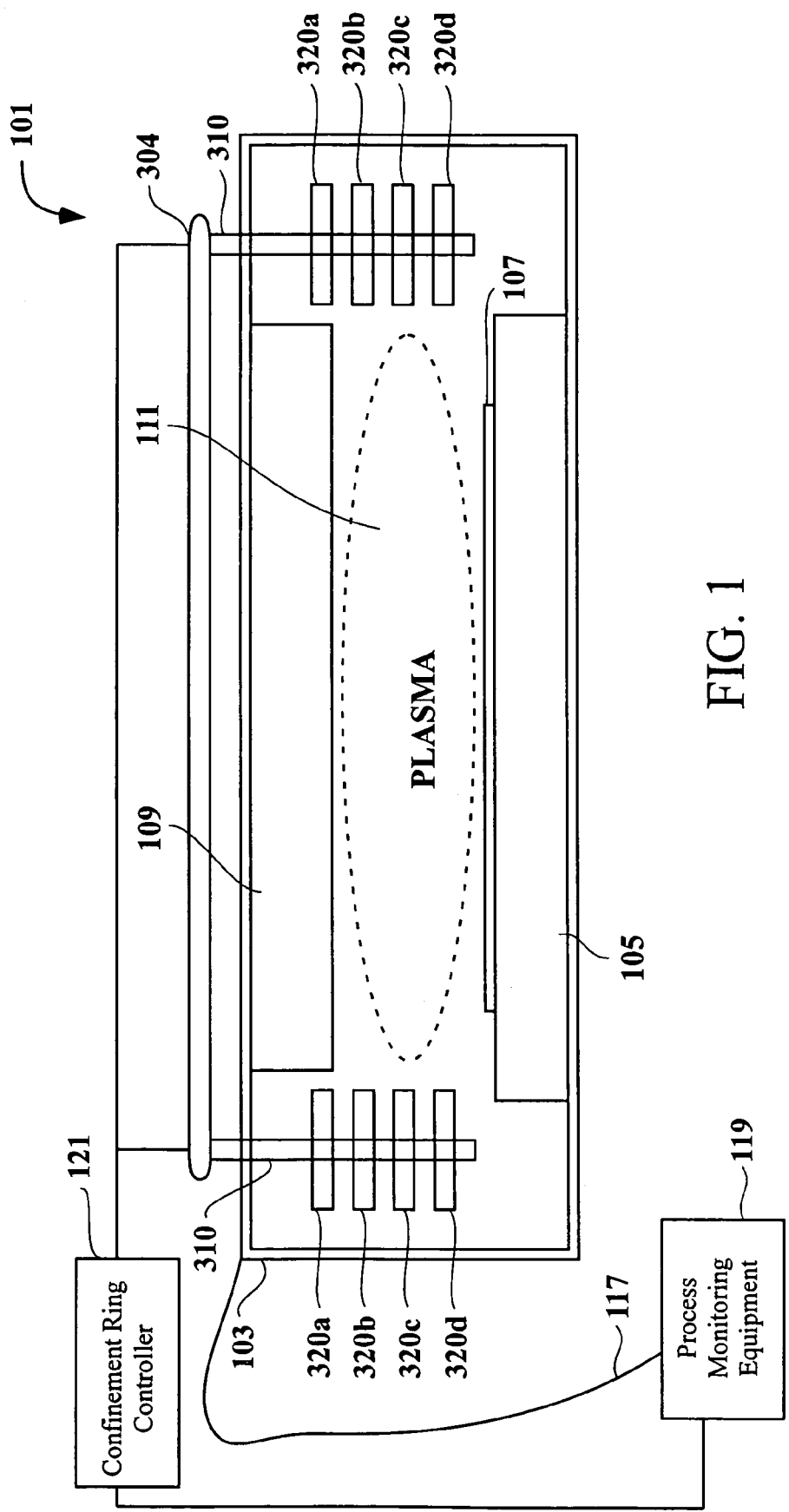
FIG. 1 is a simplified cross-sectional schematic diagram illustrating an exemplary plasma etching chamber, in accordance with one embodiment of the present invention.

FIG. 1 is a simplified cross-sectional schematic diagram illustrating an exemplary plasma etching chamber, in accordance with one embodiment of the present invention. Within plasma etching chamber 101, electrode 109 is disposed over a volume within which plasma 111 is to be generated. Wafer support structure 105 is located below the volume in which plasma 111 is to be generated. In one embodiment, wafer support structure 105 is an electrostatic chuck. Wafer support structure 105 is defined to support wafer 107 during exposure to plasma 111.

Plasma etching chamber 101 of FIG. 1 also includes a set of confinement rings 320a-d disposed around a periphery of the volume within which plasma 111 is to be generated. Confinement ring controller 121 is provided to control movement of the set of confinement rings 320a-d. In one embodiment, confinement ring controller 121 is represented as software executing on a computer system. In another embodiment, confinement ring controller 121 is represented as hardware (e.g., circuitry implemented on a chip). Regardless of the particular embodiment, confinement ring controller 121 is capable of interfacing with mechanics configured to move the set of confinement rings 320a-d in accordance with instructions received from confinement ring controller 121. Confinement ring controller 121 is also capable of setting programmable periods of time for moving and/or holding the set of confinement rings 320a-d.

Figure 2:
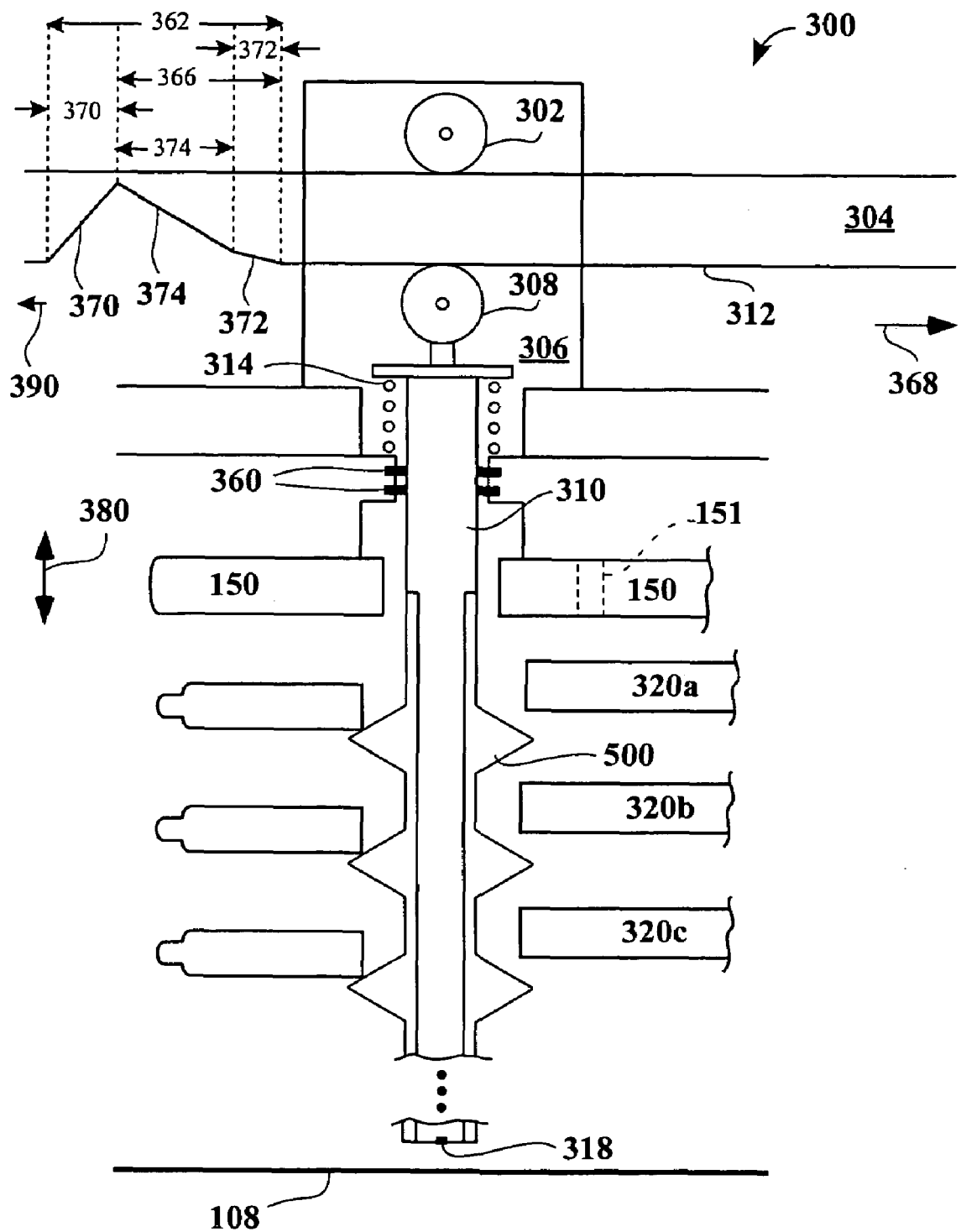
FIG. 2 illustrates, in accordance with one embodiment of the present invention, a cross-sectional schematic diagram of a plunger arrangement of a cam-based arrangement for proportionally moving confinement rings.

Still referring to FIG. 1, process monitoring equipment 119 is used for analyzing monitored conditions within chamber 101. Process monitoring equipment 119 represents one or more components or system of components capable of separating the captured input, e.g., a pressure reading from the system for analysis. In one embodiment, pressure measured from within chamber 101 is communicated through line 117 and is compared with a preset pressure control setting and the confinement ring cams moved in accordance with that comparison. That is, if chamber pressure is too low, then the space between the rings is tightened to increase the wafer area pressure, and vice versa. It should be appreciated that this pressure is monitored inside of the confined area as illustrated in FIG. 2. The pressure value, or a signal triggered by the pressure value captured through process monitoring equipment 119, is communicated to confinement ring controller 121. In turn, plungers 310 are driven in an orthogonal direction relative to confinement rings 320a-d. In one embodiment, rotation of cam ring 304 causes plungers 310 to move. It should be appreciated that the pressure within the chamber may be monitored through any known means. The monitored pressure is then communicated to confinement ring controller 121 in order to determine whether to adjust the confinement ring spacing.

During operation of chamber 100 of FIG. 1, the set of confinement rings 320a-d serve to confine plasma 111 to a particular volume ("plasma confinement volume") and control a pressure within the plasma confinement volume. The set of confinement rings 320a-d can be moved uniformly to proportionally increase and decrease a spacing or gap between adjacent confinement rings. In one embodiment, the set of confinement rings 320a-d are moved through use of a cam ring. However, it should be appreciated that many other manipulation devices can be used to move the set of confinement rings 320a-d in accordance with etching process requirements. Movement of the set of confinement rings 320a-d can be defined to cause the gaps between adjacent confinement rings to uniformly change. As will be illustrated below, the movement of plungers 310 causes confinement rings 320a-d to move proportional to each other to uniformly widen or close a gap between the confinement rings.

It should be appreciated that pressure control within the plasma confinement volume is necessary during operation due to thermal variations within the plasma etching chamber 101. Temperatures within the chamber may change during operation due to process conditions. For example, etching by-product deposition may occur on the chamber internal surfaces during operation. The etching by-product deposition will affect the heat transfer characteristics of the chamber, thereby causing temperature variations within chamber 101. The temperature variations within chamber 101 will have a corresponding affect on the pressure within the chamber. As discussed in more detail below, during etching processes that require a substantially constant pressure, a confinement ring drive is provided for controlling the pressure within the chamber.

In chamber 101, processing gases flow through the gaps between adjacent confinement rings to exit the plasma confinement volume. Thus, movement of the set of confinement rings serves to adjust a flow area provided for processing gas egress from the plasma confinement volume. Therefore, adjustment of the subject flow area provides a corresponding control of the pressure within the plasma confinement volume. During the etching process, the set of confinement rings 320a-d are uniformly moved, as confinement volume during the processing.

In accordance with one aspect of the present invention, there is provided a cam-based arrangement for uniformly raising and lowering confinement rings 320a-d within plasma processing chamber 101. The cam-based arrangement utilizes cam followers and cam ring 304 to raise and lower plungers 310, which are connected to the confinement rings. As cam ring 304 rotates, plungers 310 are raised or lowered in an orchestrated manner to raise or lower confinement rings 320a-d.

In accordance with another aspect of the present invention, the cam regions of the cam ring may be profiled to achieve fine control of confinement ring movement in order to fine-tune the pressure drop across the confinement ring area. By moving only the confinement rings to control the pressure drop across the confinement ring area (which affects the pressure at the substrate surface), the pressure at the substrate surface may be controlled without significantly affecting other etch parameters.

FIG. 2 illustrates, in accordance with one embodiment of the present invention, a cross-sectional schematic diagram of a plunger arrangement of a cam-based arrangement for proportionally moving confinement rings. Plunger arrangement 300 includes wheel 302, which is shown to be in rolling contact with cam ring 304. Wheel 302 is adjustably mounted on backing plate 306 (via, for example, a bolt and slot arrangement). Backing plate 306 may be mounted on the reactor top and is essentially immobile with respect to the reactor top.

Cam follower 308 is mounted on plunger 310. Plunger 310 and attached cam follower 308 are urged toward a lower surface 312 of cam ring 304 by spring 314. Cam follower 308 stays in rolling contact with lower surface 312 to permit plunger 310 to rise or fall with the contours in lower surface 312. Spring 314 always urges plunger 310 and cam follower 308 toward lower surface 312 of cam ring 304. As shown, plunger 310 moves upward and downward parallel to axis 380, which is substantially orthogonal to the plane defined by the confinement rings 320a-c.

Still referring to FIG. 2, bellows sleeve 500 is disposed over plunger 310 and affixed thereto. Bellows sleeve 500 includes a number of protrusions, which act to support confinement rings 320a-c. As plunger 310 is raised or lowered, confinement rings 320a-c are correspondingly raised or lowered in a uniform manner. It should be appreciated that the protrusions of bellows sleeve 500 will fold and expand similar to an accordion and cause confinement rings 320a-c to be uniformly spread apart or brought closer together. A pair of seals 360 mounted in grooves formed in the chamber top permit the pressure within the plasma processing chamber to be maintained as plunger 310 moves up and down following the contour in lower surface 312 of cam ring 304. It should be appreciated that although two seals are shown, any number of seals may be employed as desired. Additionally, any suitable number of confinement rings may be used within the processing chamber.

As mentioned earlier, the up and down movement of plunger 310 is controlled by the contour in lower surface 312 of cam ring 304. As shown in FIG. 2, lower surface 312 includes a cam region 362, of which there is preferably one for every plunger assembly. Cam region 362 preferably includes an inclining surface 366, which causes plunger 310 to be moved upward as cam ring 304 is rotated in the direction of arrow 368, and a declining surface 370, which causes plunger 310 to be moved downward as cam ring 304 is rotated in the direction of arrow 390. In one embodiment, declining surface 370 is not employed for controlling plunger 310. Instead, plunger 310 is moved upward and downward employing only inclining surface 366 as the cam ring is rotated back and forth and cam follower 308 follows the contour of inclining surface 366.

Inclining surface 366 of FIG. 2 may include two separate regions having two different slopes. As illustrated slope 374 of inclining surface 366 is steeper than a slope 372 to allow plunger 310 to move upward and downward a greater distance per degree of rotation of cam ring 304. Slope 374 may be used for coarse control, e.g., during wafer transport, and slope 372 may be employed for fine control of the position of the confinement rings, e.g., during pressure control. It should be appreciated that the use of bellows sleeve 500 provides for the proportional adjustment of the gaps between confinement rings 320a-c. In addition, the gap between insulator 150 and the top confinement ring and the gap between surface 108 and the bottom confinement ring may be adjusted. Insulator 150 further includes a pressure monitoring port 151 to capture the pressure within the confined area of the chamber. A pressure-sensing device disposed within monitoring port 151, and in communication with the process monitoring equipment 119 of FIG. 1, provides the signal used to determine if any proportional movement of confinement rings 320a-c is required. One skilled in the art will appreciate that pressure monitoring port 151 may be located at any location suitable for capturing the pressure within the plasma region, e.g., within an inner edge of insulator 150, and not necessarily near a confinement ring drive assembly. Further information on the cam drive assembly may be found in U.S. Pat. No. 6,019,060, which is hereby incorporated by reference in its entirety for all purposes.

Figure 3:
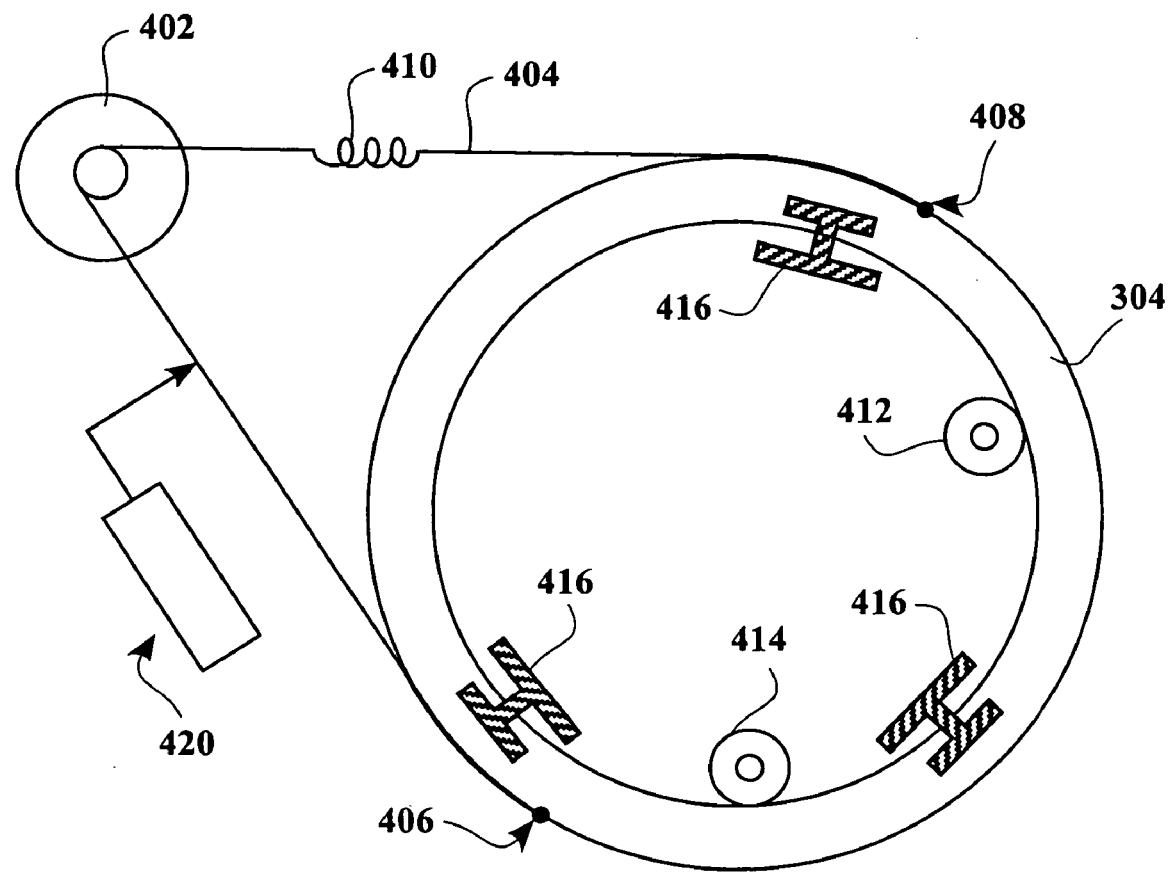
FIG. 3 shows a simplified schematic diagram of the top view of the cam-based arrangement in accordance with one embodiment of the present invention.

FIG. 3 shows a simplified schematic diagram of the top view of the cam-based arrangement in accordance with one embodiment of the present invention, including a motor 402 that is employed to rotate cam ring 304. Motor 402 is coupled to cam ring 304 via a belt 404. Belt 404 is attached to cam ring 304 at points 406 and 408 although it may be permitted to wrap around cam ring 304 if desired. A tensioning arrangement 410 takes up the slack in belt 404 and pulls cam ring 304 toward motor 402 to urge the inner surface of cam ring 304 to be in rolling contact with rollers 412 and 414 (of which two are necessary to define the center of rotation of the cam ring although any additional number of rollers may be provided).

Three plunger assemblies 416 are shown disposed about a cam ring in FIG. 3. However, any number of plunger assemblies may be employed with the cam ring. As can be appreciated by those skilled in the art, the plungers in assemblies 416 move in an orchestrated manner as their attached cam followers ride on the lower surface of the cam ring, and as cam ring is rotated clockwise and counterclockwise by motor 402 (via belt 404). Optional positional feedback arrangement 420, which may be implemented in the form of a linear potentiometer, is coupled to belt 404. However, any other type of positional sensor arrangement may be employed to provide data pertaining to the rotation of the cam ring. From the feedback data and the known profiles of the cam regions in the cam ring, the position of plungers 310 and the confinement rings in the plasma processing chamber may be derived.

In accordance with another aspect of the present invention, the ability of the cam-based arrangement to uniformly raise or lower the confinement rings without affecting the chamber volume enables the embodiments described herein to achieve pressure control during etching. Although the etch pressure (i.e., the pressure at the substrate's surface during etching) can be changed by many mechanisms (e.g., changing the input rate of the etchant source gas), the response would be improved if pressure control is accomplished locally (i.e., in the vicinity of the substrate).

Figure 4:
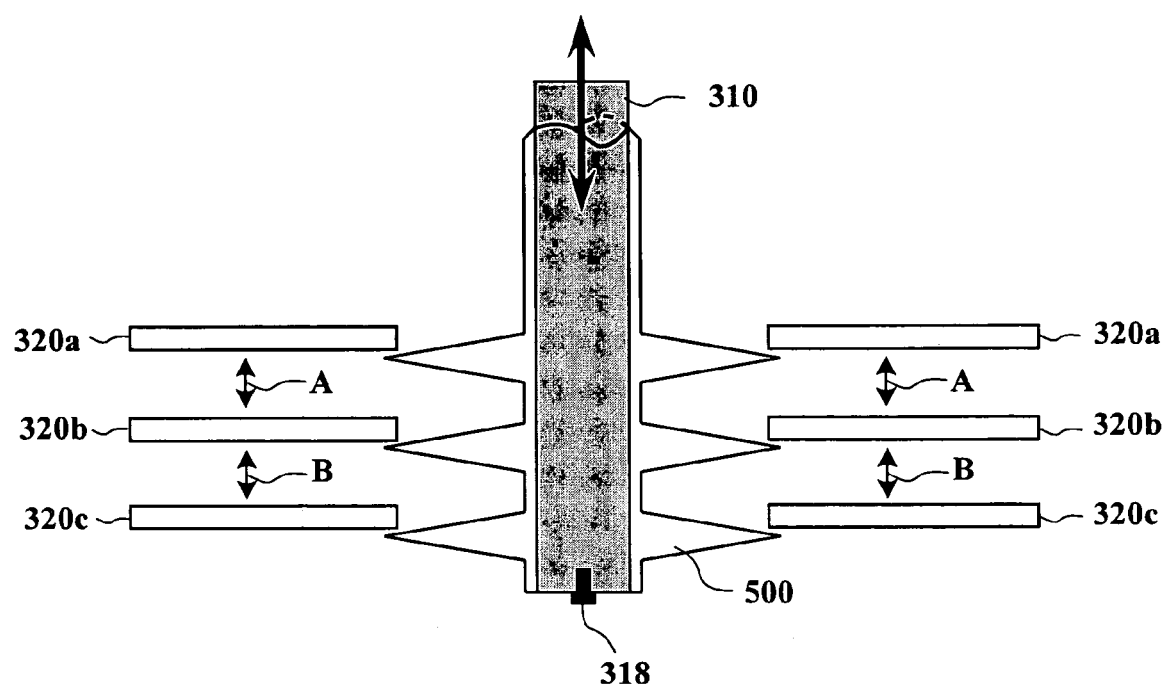
FIG. 4 is an expanded schematic diagram of the plunger and bellows sleeve that is capable of uniformly adjusting the spacing between the confinement rings in accordance with one embodiment of the invention.

FIG. 4 is an expanded schematic diagram of the plunger and bellows sleeve that is capable of uniformly adjusting the spacing between the confinement rings in accordance with one embodiment of the invention. Bellows sleeve 500 is disposed over plunger 310. Fastener 318, which in one embodiment is a plastic bolt, anchors bellows sleeve 500 to a bottom surface of plunger 310. it should be appreciated that bellows sleeve 500 may also be affixed to a top portion of plunger 310. By contracting or expanding the spacing between protrusions of bellows sleeve 500, through the movement of plunger 310, the spacing between corresponding confinement rings will change. That is, the distances represented by arrows A and B will change in a uniform manner, i.e., proportional, relative to one another. Additionally, plunger 310 may be positioned within the chamber so that the top and bottom confinement rings are defined at a certain distance from a top surface and a bottom surface, respectively, of the chamber. It should be appreciated that by evenly spacing each of the confinement rings avoids a largest space between the confinement rings from dominating how well the plasma remains confined. In one embodiment, the surface of bellows sleeve 500 has a coating applied thereto, such as a TEFLON™ coating. It should be appreciated that the coating may be any suitable coating that is compatible with the plasma environment and does not shed particles that would contaminate the substrate being etched. In addition, the coating is pliable in order to accommodate the contraction and expansion of bellows sleeve 500.

Figure 5:
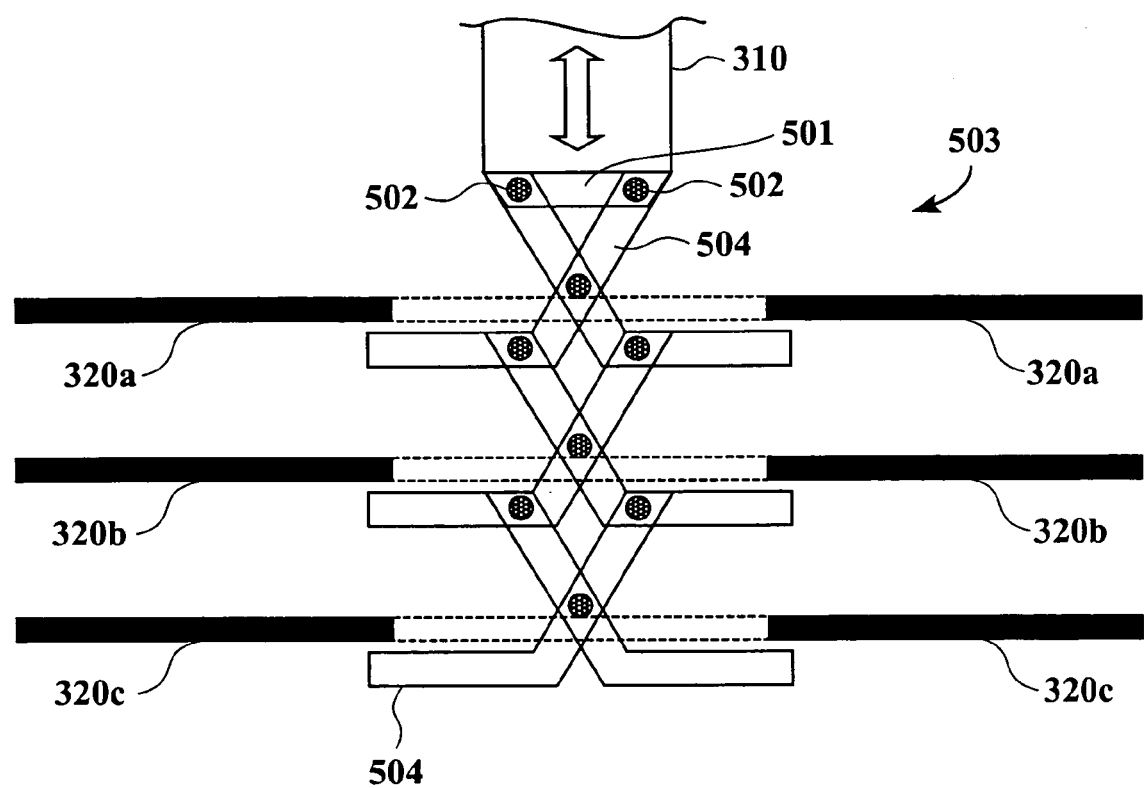
FIG. 5 is a simplified schematic diagram of a hinged lever assembly for uniformly adjusting the spacing between confinement rings as an alternative embodiment to the bellows sleeve of FIG. 4.

FIG. 5 is a simplified schematic diagram of a hinged lever assembly as an alternative embodiment to the bellows sleeve of FIG. 4. Hinged lever assembly 503 includes a plurality of hinged levers 504 pivotably interconnected through pivot points 502. Plunger 310 is affixed to crosspiece 501. Thus, the movement of plunger 310 forces confinement rings 320a-c to move proportional to one another so that the spacing between the confinement rings remains relatively consistent. More specifically, as plunger 310 is moved down towards confinement rings 320a-c, the spacing between the confinement rings becomes uniformly smaller. As plunger 310 is moved in an upward direction away from confinement rings 320a-c, the spacing between the confinement rings becomes uniformly larger.

Figure 6:
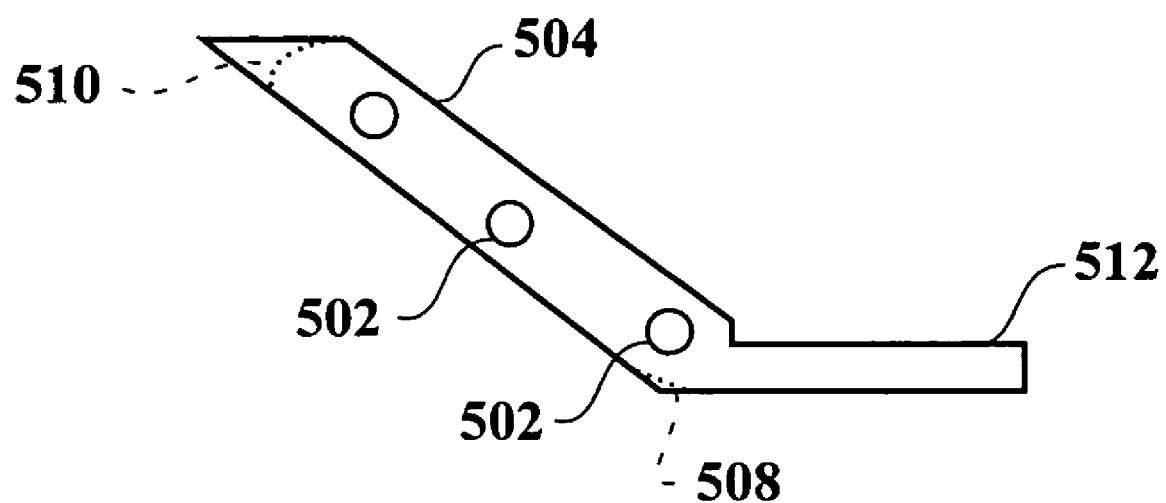
FIG. 6 is a simplified schematic diagram of one of the hinged levers of the hinged lever assembly of FIG. 5.

FIG. 6 is a simplified schematic of one of the hinged levers of the hinged lever assembly of FIG. 5. Hinged lever 504 includes a plurality of pivot points 502. Pivot points 502 are holes defined through lever 504 in one embodiment. In another embodiment, corners 508 and 510 of lever 504 are rounded. In addition, surface 512, on which the confinement ring rests may be angled to better accommodate the confinement rings over the travel range and compensate for any tilting. In FIG. 6, hinged lever 504 is shown with a slight indentation to the support portion having surface 512. In one embodiment hinged lever 504 may be composed of a metal such as stainless steel. In another embodiment, the metal may be coated with a compatible coating as mentioned above with reference to the bellows sleeve coating. Here again, the metal and coating may be of any material compatible with the etching application and environment.

Figure 7:
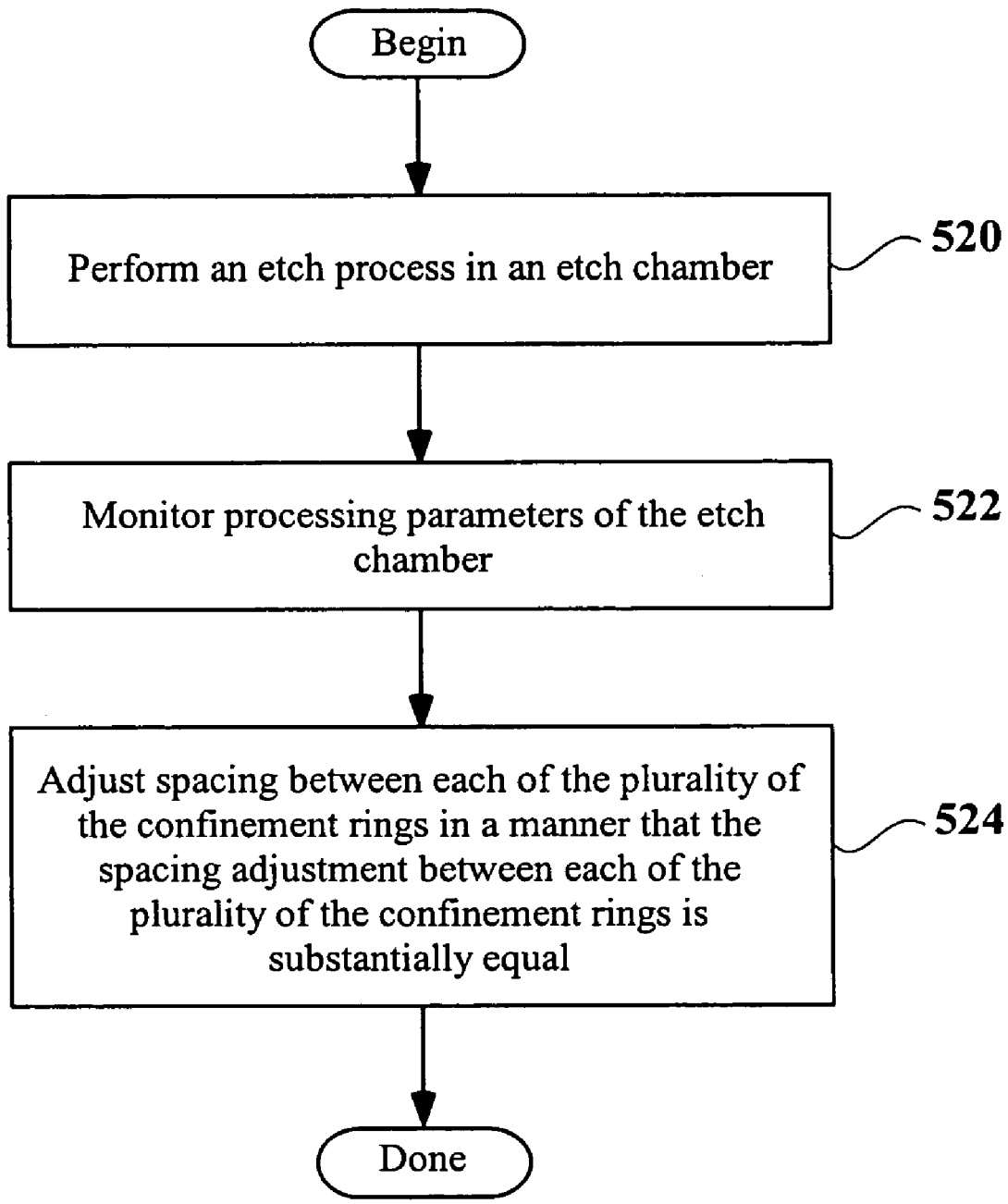
FIG. 7 is a flowchart diagram of the method operations for confining a plasma in an etch chamber having a plurality of confinement rings in accordance with one embodiment of the invention.

FIG. 7 is a flowchart diagram of the method operations for confining a plasma in an etch chamber having a plurality of confinement rings in accordance with one embodiment of the invention. The method initiates with operation 520 where an etch process is performed in an etch chamber. Here, any suitable etch process may be performed that requires a plasma to be confined and generated. The method advances to operation 522 where the processing parameters of the etch chamber are monitored. For example, the pressure within the chamber may be monitored through known techniques. As the etch operation progresses the temperature change and other factors may cause the pressure to change. One technique to counteract the pressure change is to adjust the spacing between the confinement rings according to the embodiments described herein. In operation 524 the spacing between the confinement rings is adjusted so that the spacing adjustment between each confinement ring is substantially equal. As described above with reference to FIGS. 2-6, the use of a bellows sleeve or a hinged lever assembly, in conjunction with the cam drive, will guarantee the proportional movement of each confinement ring. By maintaining proportionally consistent spacing between the confinement rings, enhanced control of the etch operation, as well as preventing one large space from dominating how well the plasma remains confined are achieved.

In summary, the above-described embodiments provide a method and apparatus for enhanced control of inter-confinement ring spacing. Through the drive system described above, substantially equal spacing between the confinement rings is achieved by proportionally varying the confinement ring spacing over a wide range of set points. The bellows sleeve or the hinged lever assembly act as a proportional adjustment support that translates movement from the plunger into proportional movement for each of the confinement rings.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A confinement assembly for a semiconductor processing chamber, comprising:
   a plurality of confinement rings disposed over each other, each of the plurality of confinement rings separated by a space, each of the plurality of confinement rings having a plurality of holes defined therein;
   a plunger extending through aligned holes of corresponding confinement rings, the plunger moveable in a plane substantially orthogonal to the confinement rings, and
   a proportional adjustment support affixed to the plunger, the proportional adjustment support configured to support the confinement rings, such that as the plunger moves in the plane the space separating each of the plurality of confinement rings is proportionally adjusted, wherein the proportional adjustment support includes a bellows sleeve having a number of protrusions, the protrusions having a diameter greater than a diameter of the plurality of holes defined through each of the plurality of confinement rings, wherein the plunger and the sleeve are disposed through each of the plurality of holes.

2. The confinement assembly of claim 1, wherein the number of protrusions being equal to a number of confinement rings.

3. The confinement assembly of claim 1, wherein the bellows sleeve includes a coating of a durable non-reactive polymer.

4. The confinement assembly of claim 1, further including:
   a cam follower affixed to the plunger; and
   a cam ring in which the cam follower is in rolling contact with.

5. A semiconductor processing chamber, comprising:
   a plurality of confinement rings configured to confine a plasma within a region of the chamber;
   a plurality of bellows sleeves supporting the confinement rings; and
   a plurality of plungers affixed to corresponding bellows sleeves, the plurality of plungers moving along an axis substantially orthogonal to a plane of the confinement rings such that movement of the plurality of plungers results in spaces between each of the plurality of confinement rings to proportionally adjust, wherein each of the plurality of bellows sleeves includes a number of protrusions, the protrusions having a diameter greater than a diameter of a hole defined through each of the plurality of confinement rings, wherein one of the plungers and one of the bellows sleeves is disposed through the hole.

6. The processing chamber of claim 5, further comprising:
   a cam ring disposed on a top surface of the processing chamber.

7. The processing chamber of claim 6, further comprising:
   cam followers correspondingly affixed to each of the plungers, each of the cam followers rollably connected to the cam ring.

8. The processing chamber of claim 6, further comprising:
   springs corresponding to each of the plurality of plungers, the springs providing tension forcing the corresponding cam followers against a surface of the cam ring.

9. The processing chamber of claim 6, wherein the cam ring includes an inclining surface and a declining surface.

* * * * *